United States Patent
Lan et al.

(10) Patent No.: US 10,772,224 B2
(45) Date of Patent: Sep. 8, 2020

(54) ELECTRONIC DEVICE

(71) Applicants: Wei-Hao Lan, Taipei (TW);
Cheng-Shiue Jan, Taipei (TW);
Yao-Hsien Yang, Taipei (TW);
Jyh-Chyang Tzou, Taipei (TW);
Hsiao-Wen Tseng, Taipei (TW);
Yi-Hsun Liu, Taipei (TW);
Chen-Cheng Wang, Taipei (TW);
Chun-Chieh Chen, Taipei (TW);
Han-Tsai Liu, Taipei (TW)

(72) Inventors: Wei-Hao Lan, Taipei (TW);
Cheng-Shiue Jan, Taipei (TW);
Yao-Hsien Yang, Taipei (TW);
Jyh-Chyang Tzou, Taipei (TW);
Hsiao-Wen Tseng, Taipei (TW);
Yi-Hsun Liu, Taipei (TW);
Chen-Cheng Wang, Taipei (TW);
Chun-Chieh Chen, Taipei (TW);
Han-Tsai Liu, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 0 days.

(21) Appl. No.: 16/261,571

(22) Filed: Jan. 30, 2019

(65) Prior Publication Data
US 2019/0239369 A1    Aug. 1, 2019

Related U.S. Application Data

(60) Provisional application No. 62/668,786, filed on May 8, 2018, provisional application No. 62/624,085, filed on Jan. 30, 2018.

(51) Int. Cl.
*H05K 5/02* (2006.01)
*H05K 5/00* (2006.01)
*G06F 1/16* (2006.01)

(52) U.S. Cl.
CPC ......... *H05K 5/0217* (2013.01); *G06F 1/1652* (2013.01); *H05K 5/0017* (2013.01)

(58) Field of Classification Search
CPC ... G06F 1/1652; H05K 5/0017; H05K 5/0217
See application file for complete search history.

(56) References Cited

U.S. PATENT DOCUMENTS 9,081,540 B1 *  7/2015  Cho ..................... G06F 1/1601
9,123,290 B1 *  9/2015  Cho ..................... G06F 1/1652
(Continued)

FOREIGN PATENT DOCUMENTS

TW            201801059            1/2018

*Primary Examiner* — Hoa C Nguyen
*Assistant Examiner* — Keith DePew
(74) *Attorney, Agent, or Firm* — JCIPRNET

(57) ABSTRACT

An electronic device includes a first body, a second body and at least one driving mechanism. The second body includes a casing and a flexible screen installed on the casing. The driving mechanism includes a shaft, a driving element and a linking assembly. The shaft has first and second connecting portions opposite to each other, the first connecting portion is fixed to the first body, and the second body is pivoted to the second connecting portion. The driving element is sleeved on the shaft and is located in the casing. The linking assembly is carried by the casing and covered by the flexible screen. When the second body is folded onto the first body, the flexible screen keeps flat. When the second body is unfolded with respect to the first body, the driving element is rotated and moved with respect to the shaft to drive the linking assembly to move, and the linking assembly drives the flexible screen to bend.

14 Claims, 15 Drawing Sheets

(56) References Cited

U.S. PATENT DOCUMENTS

| | | | | |
|---|---|---|---|---|
| 9,182,620 B1* | 11/2015 | Yu | | G06F 1/1601 |
| 9,304,539 B2* | 4/2016 | Song | | G06F 1/1601 |
| 9,703,319 B2* | 7/2017 | Guo | | G09F 9/33 |
| 9,843,758 B2* | 12/2017 | Park | | G06F 1/1601 |
| 9,846,450 B2* | 12/2017 | Park | | G06F 1/1616 |
| 9,934,708 B2* | 4/2018 | Sun | | G09F 9/301 |
| 9,978,293 B2* | 5/2018 | Cho | | H05K 5/0217 |
| 9,980,399 B2* | 5/2018 | Cho | | G09F 9/301 |
| 9,983,428 B2* | 5/2018 | Im | | G02F 1/133308 |
| 10,194,540 B2* | 1/2019 | Sun | | H01L 51/5237 |
| 10,229,618 B2* | 3/2019 | Chen | | G09F 19/02 |
| 10,401,908 B2* | 9/2019 | Chen | | G02F 1/133305 |
| 2013/0155655 A1* | 6/2013 | Lee | | H05K 5/03 |
| | | | | 362/97.1 |
| 2014/0247566 A1* | 9/2014 | Lee | | H05K 5/03 |
| | | | | 361/749 |
| 2015/0029166 A1* | 1/2015 | Park | | G06F 1/1601 |
| | | | | 345/184 |
| 2015/0130775 A1* | 5/2015 | Kim | | G06F 1/1652 |
| | | | | 345/205 |
| 2015/0296641 A1* | 10/2015 | Song | | H05K 5/0217 |
| | | | | 361/679.01 |
| 2015/0331445 A1* | 11/2015 | Liu | | G06F 1/203 |
| | | | | 361/679.27 |
| 2016/0156871 A1* | 6/2016 | Liu | | G06F 1/1601 |
| | | | | 348/836 |
| 2016/0192519 A1* | 6/2016 | Song | | H05K 5/0217 |
| | | | | 361/679.01 |
| 2017/0292503 A1* | 10/2017 | Lee | | F03G 7/065 |
| 2017/0315401 A1* | 11/2017 | Im | | G02F 1/133308 |

\* cited by examiner

ELECTRONIC DEVICE

CROSS-REFERENCE TO RELATED APPLICATION

This application claims the priority benefit of U.S. provisional application Ser. No. 62/624,085, filed on Jan. 30, 2018 and U.S. provisional application Ser. No. 62/668,786, filed on May 8, 2018. The entirety of each of the above-mentioned patent applications is hereby incorporated by reference herein and made a part of specification.

BACKGROUND

Technical Field

The disclosure relates to an electronic device, and particularly relates to an electronic device with a flexible screen.

Description of Related Art

Since a curved-surface display screen may provide users with a surround field of vision to achieve a visual immersion effect, some manufacturers have developed notebook computers with curved-surface displays. The commonly used curved-surface display has its own curvature and the curvature is fixed and cannot be change. In order to make the curved-surface display to be folded and unfolded with respect to a host of the notebook computer, and maintain integrity of an appearance of the notebook computer, a casing of the host must be designed and manufactured according to the curvature of the curved-surface display, which leads to problems of high manufacturing cost and difficulty in meeting design requirements of thin products.

SUMMARY

The disclosure is directed to an electronic device, which is not only convenient for usage, but also provides a user with a surround field of vision and meets a design requirement of product thinning.

An embodiment of the disclosure provides an electronic device including a first body, a second body and at least one driving mechanism. The second body includes a casing and a flexible screen installed on the casing. The driving mechanism includes a shaft, a driving element and a linking assembly. The shaft has a first connecting portion and a second connecting portion opposite to each other, where the first connecting portion is fixed to the first body, and the second body is pivoted to the second connecting portion. The driving element is sleeved on the shaft, and is located in the casing. The linking assembly is carried by the casing, and is covered by the flexible screen. When the second body is folded onto the first body, the flexible screen keeps flat. When the second body is unfolded with respect to the first body, the driving element is rotated and moved with respect to the shaft to drive the linking assembly to move, and the linking assembly drives the flexible screen to bend.

Based on the above description, the electronic device of an embodiment of the disclosure is integrated with the driving mechanism, which is configured to make the second body to rotate with respect to the first body. Moreover, during the process that the second body is unfolded with respect to the first body, the linking assembly of the driving mechanism may be driven by the driving element to move, so as to drive the flexible screen of the second body to produce a corresponding degree of bending. On the other hand, when the electronic device is in a folded state, the flexible screen is not bent (i.e., keeps flat), so that the thickness of the electronic device would not be increased, so as to meet the design requirement of product thinning. In other words, by rotating the second body with respect to the first body, the flexible screen is switched between a bending state and a flat state, which is very convenient for the user to use.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
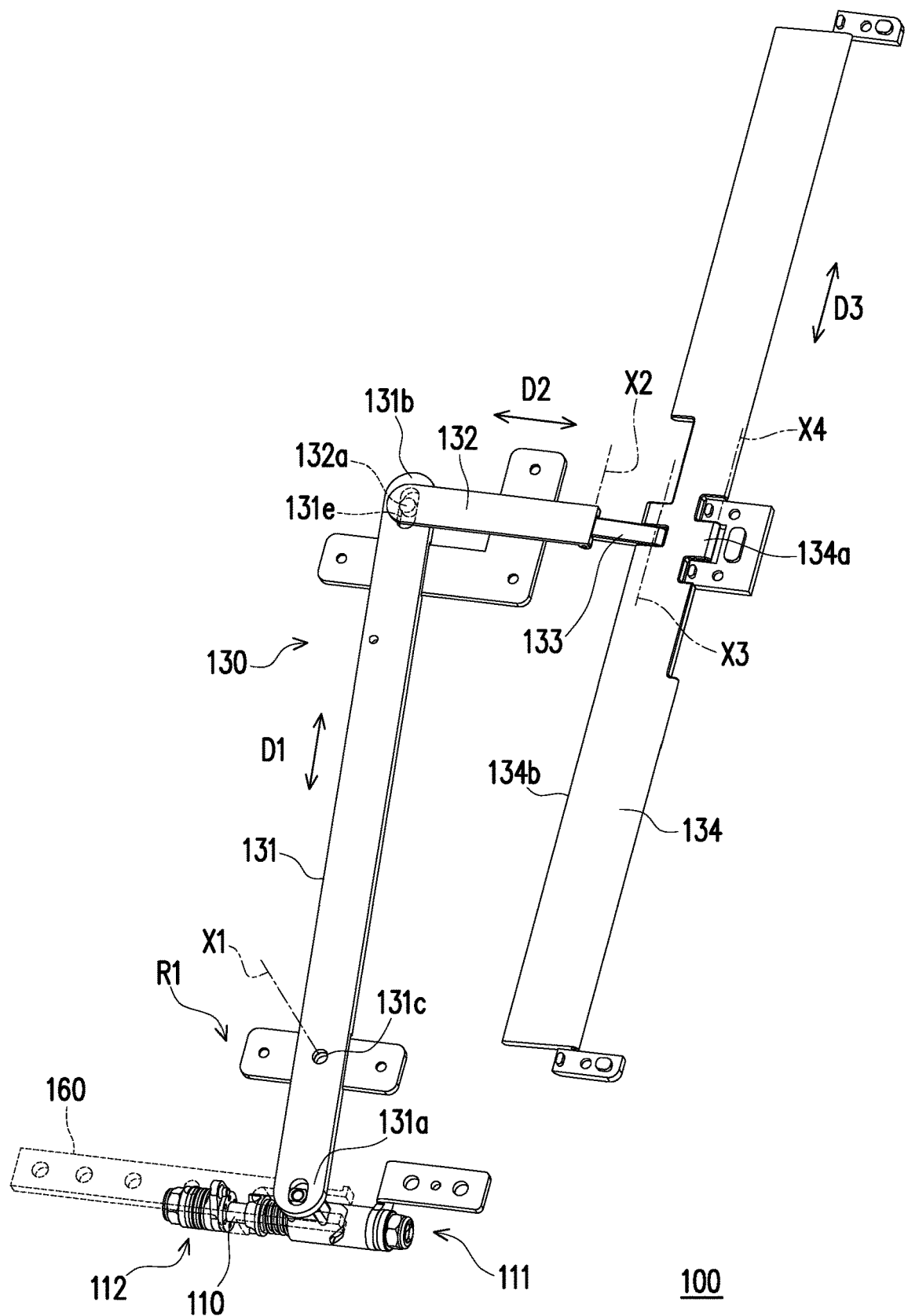
FIG. 1A is a schematic diagram of a driving mechanism before actuation according to a first embodiment of the disclosure.
Figure 1B:
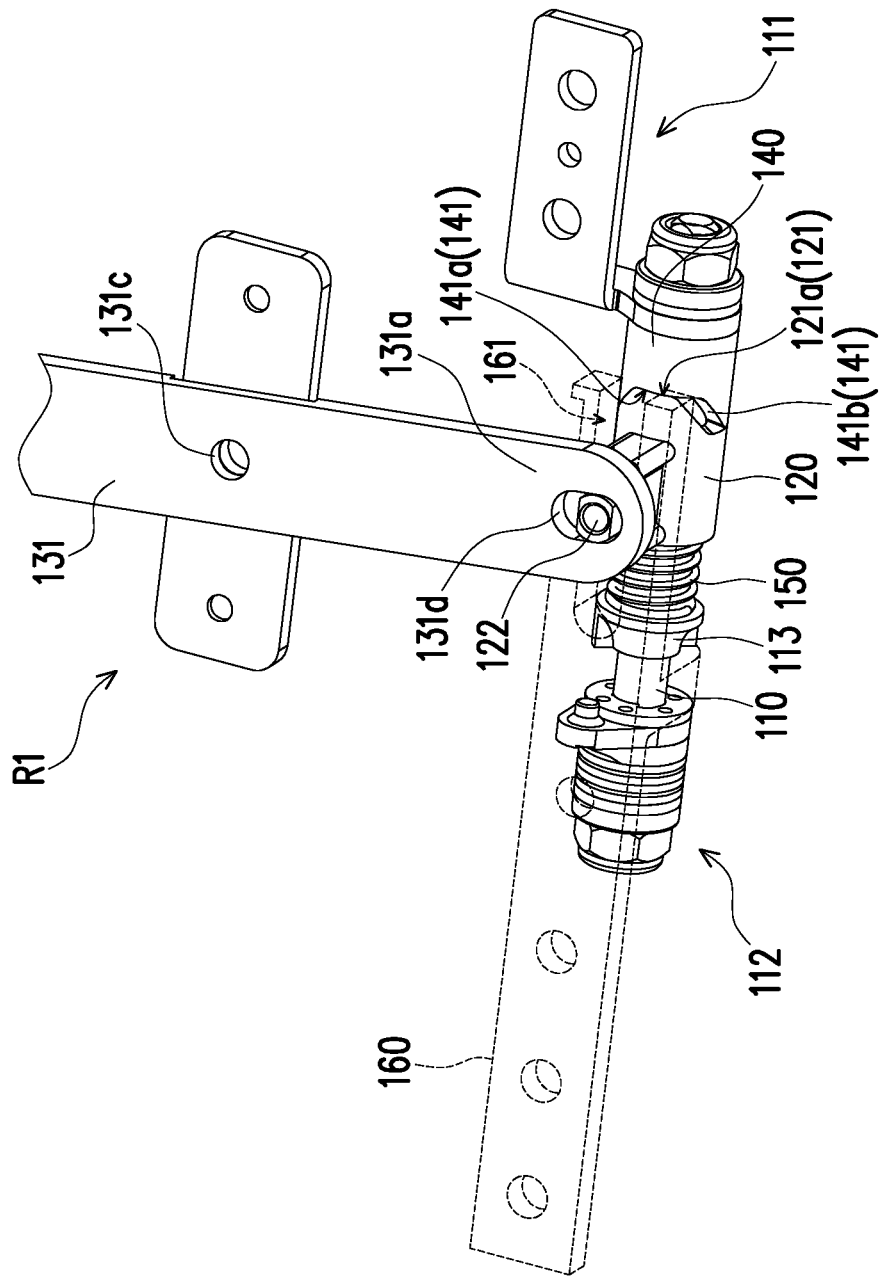
FIG. 1B is a partial enlarged view of a region R1 of FIG. 1A.
Figure 1C:
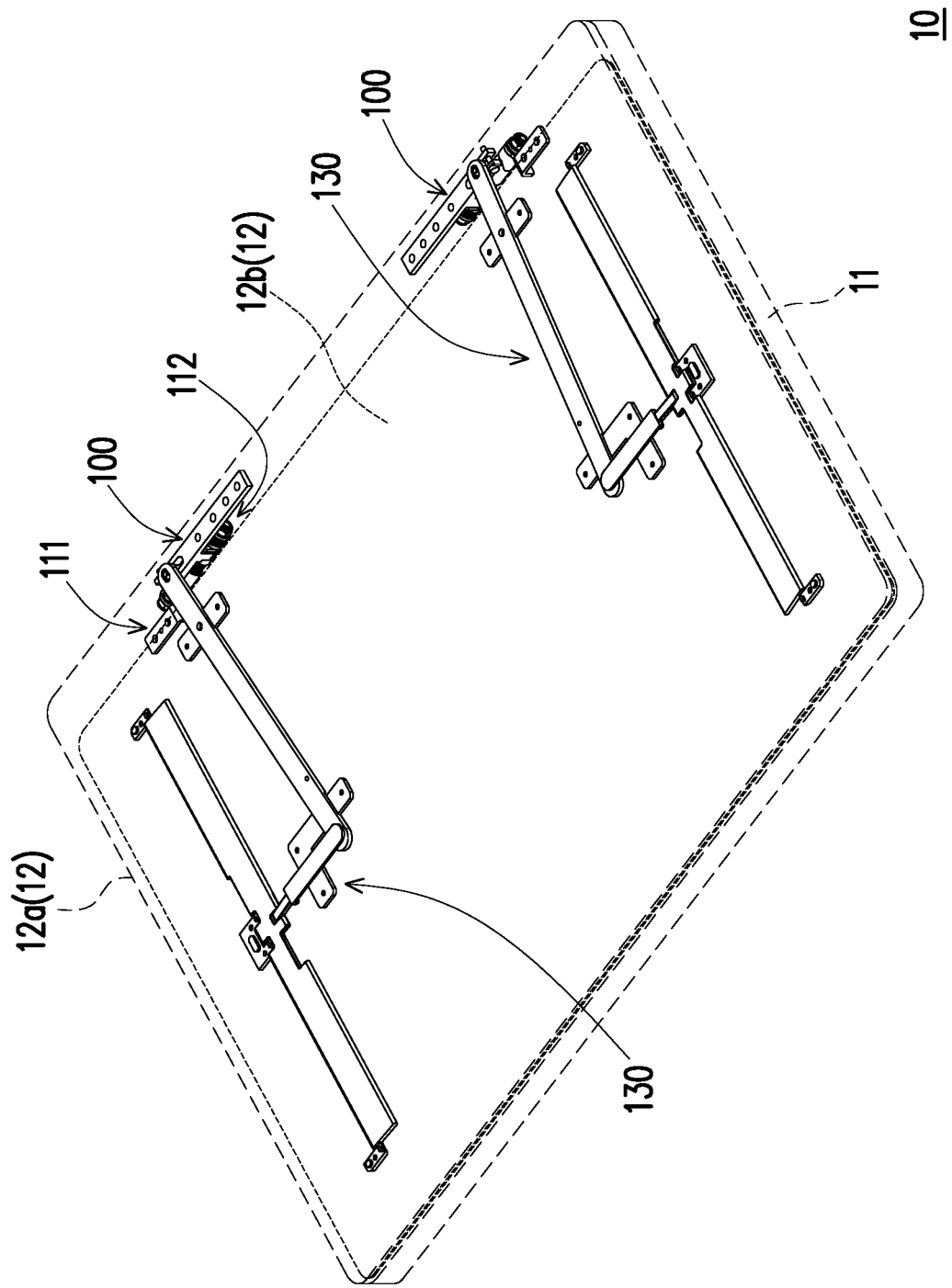
FIG. 1C is a schematic diagram of an electronic device in a folded state according to the first embodiment of the disclosure.
Figure 2A:
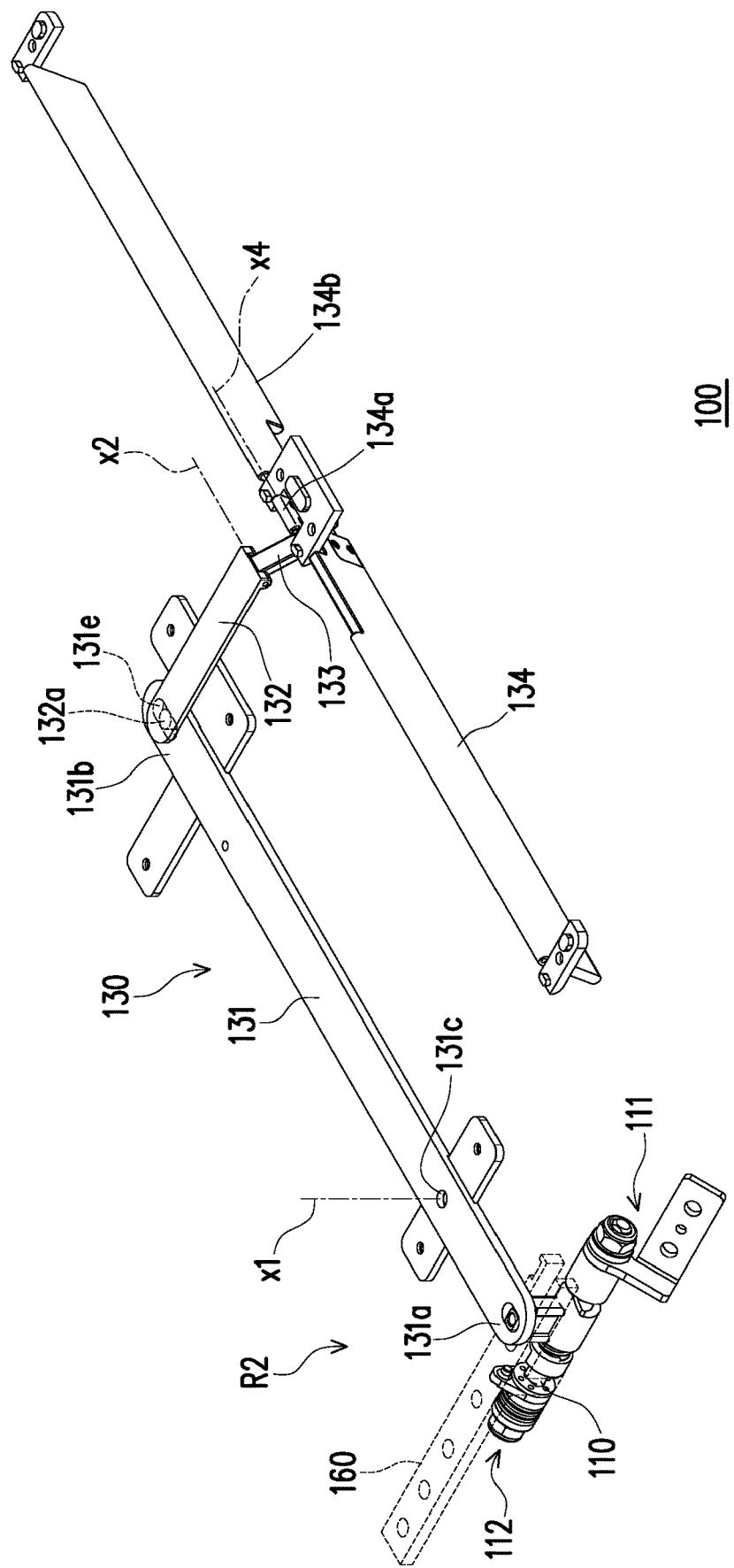
FIG. 2A is a schematic diagram of the driving mechanism after actuation according to the first embodiment of the disclosure.
Figure 2B:
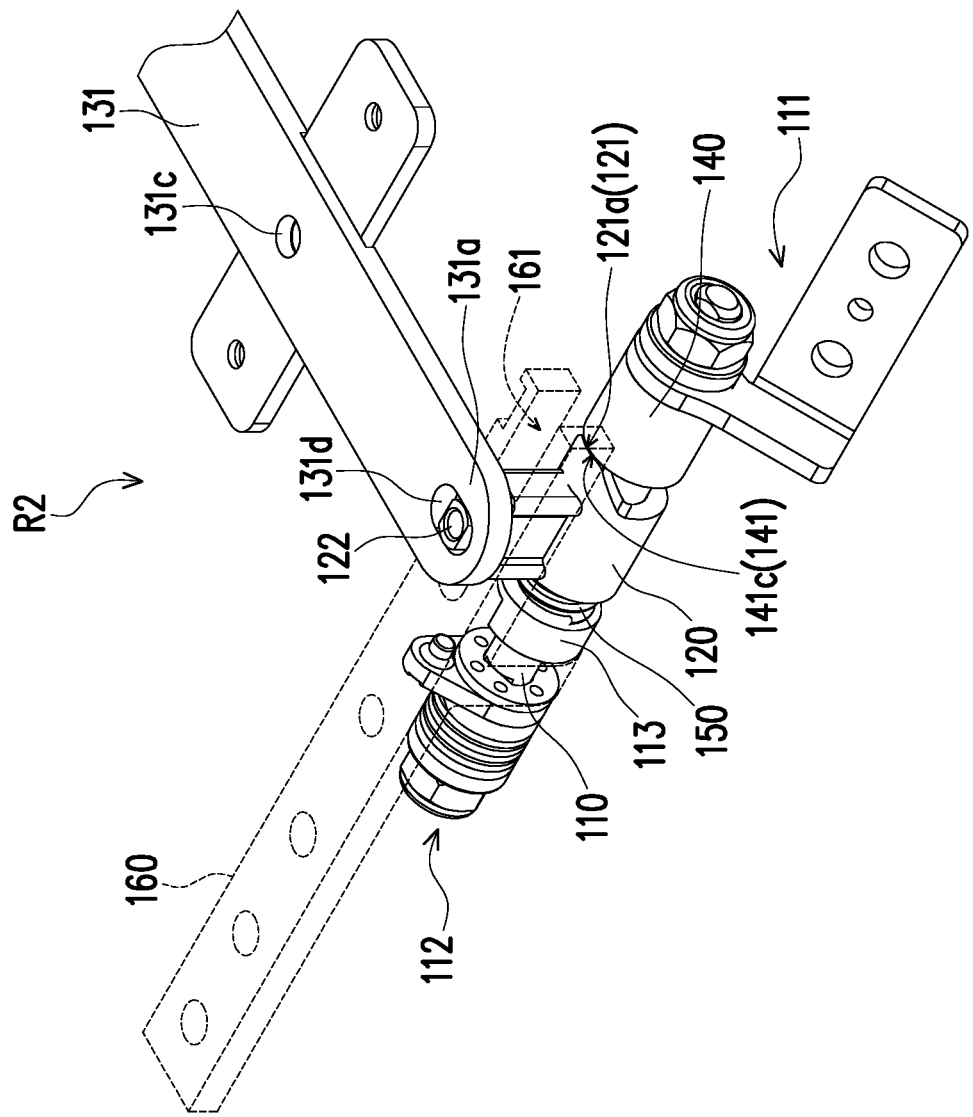
FIG. 2B is a partial enlarged view of a region R2 of FIG. 2A.
Figure 2C:
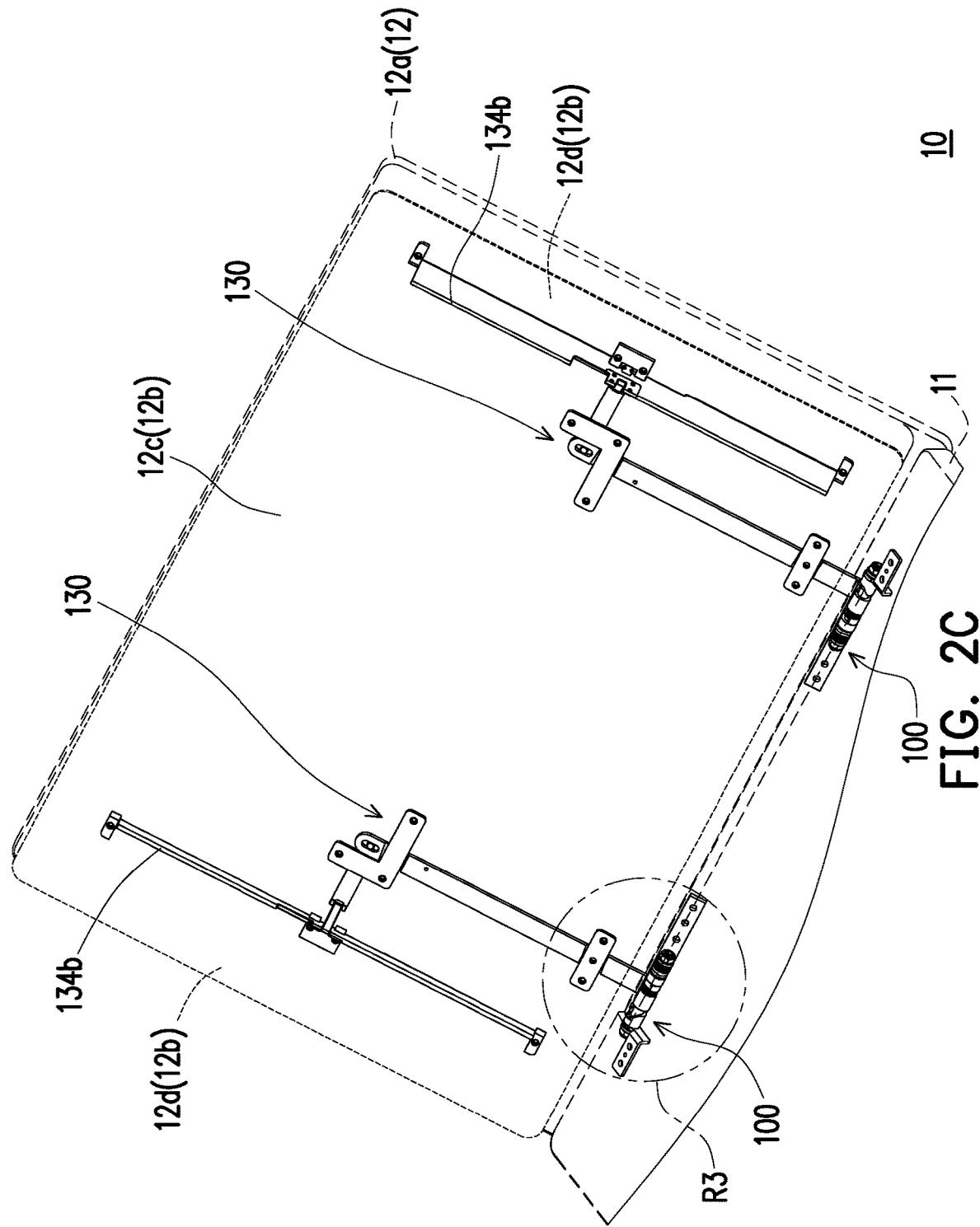
FIG. 2C is a schematic diagram of the electronic device in an unfolded state according to the first embodiment of the disclosure.
Figure 2D:
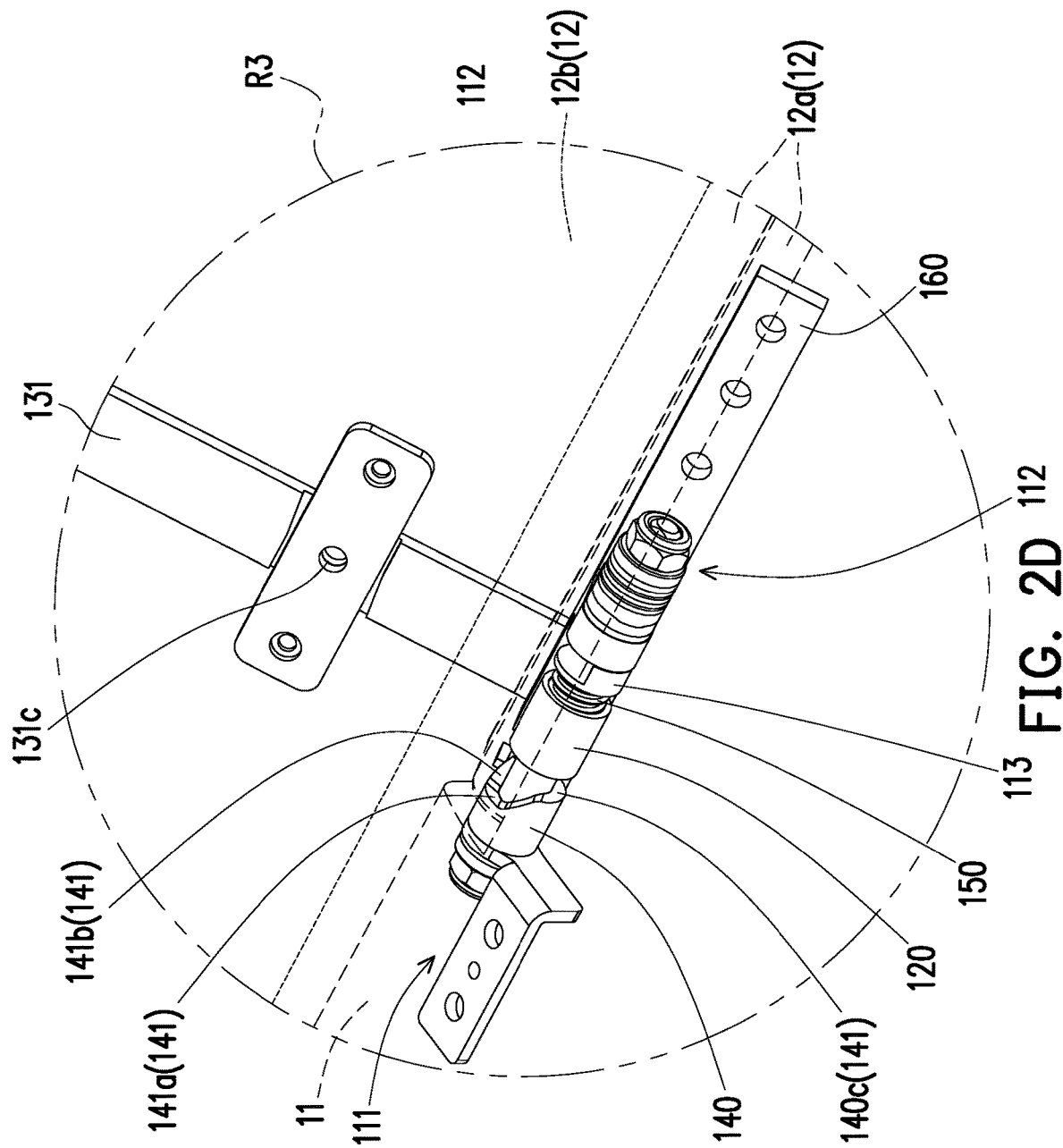
FIG. 2D is a partial enlarged view of a region R3 of FIG. 2C.

FIG. 1A is a schematic diagram of a driving mechanism before actuation according to a first embodiment of the disclosure. FIG. 1B is a partial enlarged view of a region R1 of FIG. 1A. FIG. 1C is a schematic diagram of an electronic device in a folded state according to the first embodiment of the disclosure. FIG. 2A is a schematic diagram of the driving mechanism after actuation according to the first embodiment of the disclosure. FIG. 2B is a partial enlarged view of a region R2 of FIG. 2A. FIG. 2C is a schematic diagram of the electronic device in an unfolded state according to the first embodiment of the disclosure. FIG. 2D is a partial enlarged view of a region R3 of FIG. 2C. For clarity and simplicity's sake, only a part of a first body 11 is illustrated in FIG. 2C, the first body 11 and a second body 12 in FIG. 1C, FIG. 2C and FIG. 2D are illustrated in dash lines, and a position-limiting frame 160 of FIG. 1A, FIG. 1B, FIG. 2A and FIG. 2B is illustrated in dash lines.

Referring to FIG. 1A, FIG. 1B and FIG. 2A, in the embodiment, a part of components of the driving mechanism 100 may serve as a hinge structure of the electronic device 10 to connect the first body 11 and the second body 12 of the electronic device 10, so as to make the second body 12 can be rotated with respect to the first body 11. For example, the number of the driving mechanisms 100 is two, and the two driving mechanisms 100 are symmetrically disposed in the electronic device 100. In other embodiments, the number and location of the driving mechanisms in the electronic device may be adjusted according to an actual requirement.

Further, the driving mechanism 100 includes a shaft 110, a driving element 120 and a linking assembly 130, wherein the shaft 110 has a first connecting portion 111 and a second connecting portion 112 opposite to each other. The first connecting portion 111 is fixed to the first body 11, and the second body 12 is pivoted to the second connecting portion 112. The second body 12 includes a casing 12a and a flexible screen 12b installed on the casing 12a, wherein the linking assembly 130 is carried by the casing 12a and the flexible screen 12b covers the linking assembly 130. Namely, the linking assembly 130 is located between the casing 120a and the flexible screen 12b. When the electronic device 10 is in a folded state, the flexible screen 12b is not bent and thus a thickness of the electronic device 10 would not be increased, so as to satisfy a design requirement of thin products.

Referring to FIG. 1A to FIG. 2D, the driving element 120 is sleeved on the shaft 110, and is located in the casing 12a. The driving element 120 has a degree of freedom of motion to rotate and move with respect to the shaft 110, so as to move between the first connecting portion 111 and the second connecting portion 112. The linking assembly 130 is connected to the driving element 120, and during a period that the driving element 120 is rotated and moved with respect to the shaft 110, the linking assembly 130 may be driven by the driving element 120 and thus moving. Since the driving element 120 is disposed in the casing 12a, when the second body 12 is rotated with respect to the first body 11, the driving element 120 is rotated with respect to the shaft 110 along with the second body 12 and is guided to move with respect to the shaft 110. Namely, by making the second body 12 to rotate with respect to the first body 11, the linking assembly 130 may produce a corresponding degree of movement, which is very convenient in operation for the user.

During a period of switching the folded state of FIG. 1C to an unfolded state of FIG. 2C, the linking assembly 130 may drive the flexible screen 120b to bend. Further, the flexible screen 12b includes a middle portion 12c and two side wing portions 12d, and the middle portion 12c is located between the two side wing portions 12d. The middle portion 12c is fixed to the casing 12a, and the two side wing portions 12d may be swayed with respect to the casing 12a, so as to switch the flexible screen 12b between a bending state and a non-bending state. Since the two driving mechanisms 100 are symmetrically disposed in the electronic device 10, and the linking assembly 130 of each of the driving mechanisms 100 is disposed corresponding to one side wing portion 12d, when each of the driving elements 120 drives the corresponding linking assembly 130 to move, each of the side wing portions 12d is driven by the corresponding linking assembly 130 to bend with respect to the middle portion 12c. As show in FIG. 2C, the flexible screen 12b is similar to a curved-surface display screen, and is capable of providing users with a surround field of vision to achieve a visual immersion effect.

In the embodiment, the driving mechanism 100 further includes a guiding element 140 fixed on the shaft 110. The guiding element 140 may be formed integrally with the shaft 110, or is sleeved on and fixed to the shaft 110, where at least a part of the guiding element 140 is disposed in the casing 12a, and leans against the driving element 120. On the other hand, the guiding element 140 is located between the first connecting portion 111 and the driving element 120, and the driving element 120 is located between the guiding element 140 and the second connecting portion 112. When the second body 12 is rotated with respect to the first body 11, the driving element 120 is rotated with respect to the shaft 110 along with the second body 12, and is guided by the guiding element 140 to move with respect to the shaft 110.

Further, the guiding element 140 has a first guiding surface 141, and the driving element 120 has a second guiding surface 121 matching the first guiding surface 141. The second guiding surface 121 leans against the first guiding surface 141. During the process that the driving element 120 is rotated with respect to the shaft 110, the second guiding surface 121 and the first guiding surface 141 push against each other to move the driving element 120 with respect to the shaft 110. Further, the first guiding surface 141 and the second guiding surface 121 are not all planes, but are composed of planes, slopes and curved surfaces. The first guiding surface 141 of the guiding element 140 has a first buffer section 141a and a guiding section 141b connected to the first buffer section 141a, and the second guiding surface 121 of the driving element 120 has a driving section 121a.

For example, the first guiding surface 141 has a recess, wherein the first buffer section 141a may be a bottom surface of the recess, and the guiding section 141b may be a slope of the recess. On the other hand, the driving section 121a may be a convex surface of the second guiding surface 121, wherein the recess of the first guiding surface 141 may be used for containing the convex surface of the second guiding surface 121, and the recess of the first guiding surface 141 is slightly greater than the convex surface of the second guiding surface 121. Therefore, during the process that the driving element 120 is rotated with respect to the shaft 110, the convex surface of the second guiding surface 121 may be slid in the recess of the first guiding surface 141, and may be further moved out of the recess of the first guiding surface 141.

To be specific, during the process that the driving element 120 is rotated with respect to the shaft 110, if the driving section 121a leans against the first buffer section 141a, and slides on the first buffer section 141a, the driving element 120 is not moved with respect to the shaft 110. If the driving section 121a is moved away from the first buffer section 141a and is slid on the guiding section 141b, the driving element 120 is moved with respect to the shaft 110. Under a state shown in FIG. 1C, the second body 12 is folded onto the first body 11, and the flexible screen 12b keeps flat. If the second body 12 is rotated with respect to the first body 11 (or unfolded with respect to the first body 11) under the state shown in FIG. 1C, the linking assembly 130 does not immediately produce a motion, and only after the second body 12 is rotated with respect to the first body 11 by a specific angle (or unfolded the specific angle), the driving section 121a of the driving element 120 is slid on the guiding section 141b after moving away from the first buffer section 141a, such that the driving element 120 moved with respect to the shaft 110 drives the linking assembly 130, and the linking assembly 130 drives the flexible screen 12b to bend. According to such design, the bent flexible screen 12b is avoided to contact the first body 11, and the more the driving section 121a is away from the first buffer section 141a, the larger a bending degree of the flexible screen 12b is.

Following the above description, the first guiding surface 141 further has a second buffer section 141c, wherein the second buffer section 141c is connected to the guiding section 141b, and the guiding section 141b is located between the first buffer section 141a and the second buffer section 141b. The second buffer section 141c may be a plane of the first guiding surface 141, and a distance between any point of the second buffer section 141c and the first buffer section 141a is a constant value. During the process of continuously rotating the second body 12 with respect to the first body 11 to enlarge the unfolded angle there between, the first driving element 120 is continuously rotated and moved with respect to the shaft 110, and the linking assembly 130 is also continuously moved to drive the flexible screen 12b to produce a larger degree of bending. Until the driving section 121a is moved out of the guiding section 141b and moved into the second buffer section 141c, the driving element 120 stops moving with respect to the shaft 110, but may still rotate with respect to the shaft 110. Now, the linking assembly 130 stops moving, and the flexible screen 12b also stops bending. Such design may prevent the flexible screen 12b from being bent limitlessly and avoid permanent damage to the flexible screen 12b.

In the embodiment, the driving mechanism 100 further includes an elastic element 150, for example, a compression spring or other type of spring, which is disposed in the casing 12a. Further, the shaft 110 has a position-limiting portion 113 located between the first connecting portion 111 and the second connecting portion 112. The driving element 120 is configured to move between the position-limiting portion 113 and the guide element 140, wherein two opposite ends of the elastic element 150 are respectively connected to the position-limiting portion 113 and the driving element 120, and is sleeved on the shaft 110. As the driving section 121a slides on the guiding section 141b and is away from the first buffer section 141a, a compressing degree of the elastic element 140 compressed by the driving element 120 is increased. Until the driving section 121a is moved out of the guiding section 141b and moved into the second buffer section 141c, the driving element 120 stops moving with respect to the shaft 110, and the elastic element 150 is not compressed by the driving element 120. Moreover, since the driving section 121a leans against the plane (i.e., the second buffer section 141c) of the first guiding surface 141, an elastic restoring force of the elastic element 150 cannot easily push the driving element 120.

Conversely, if the second body 120 is rotated with respect to the first body 11 to recover from the unfolded state shown in FIG. 2C to the folded state show in FIG. 1C, the driving element 120 is rotated with respect to the shaft 110 to make the driving section 121a to move away from the second buffer section 141c and move into the guiding section 141b. Now, the elastic restoring force of the elastic element 150 may push the driving element 120 to move with respect to the shaft 110, so as to make the driving section 121a to move close to the first buffer section 141a, and until the driving section 121a leans against the first buffer section 141a, the driving element 120 stops moving. Correspondingly, the linking assembly 130 returns to the state before movement, and the flexible screen 12b also returns to the unbent state.

Figure 2E:
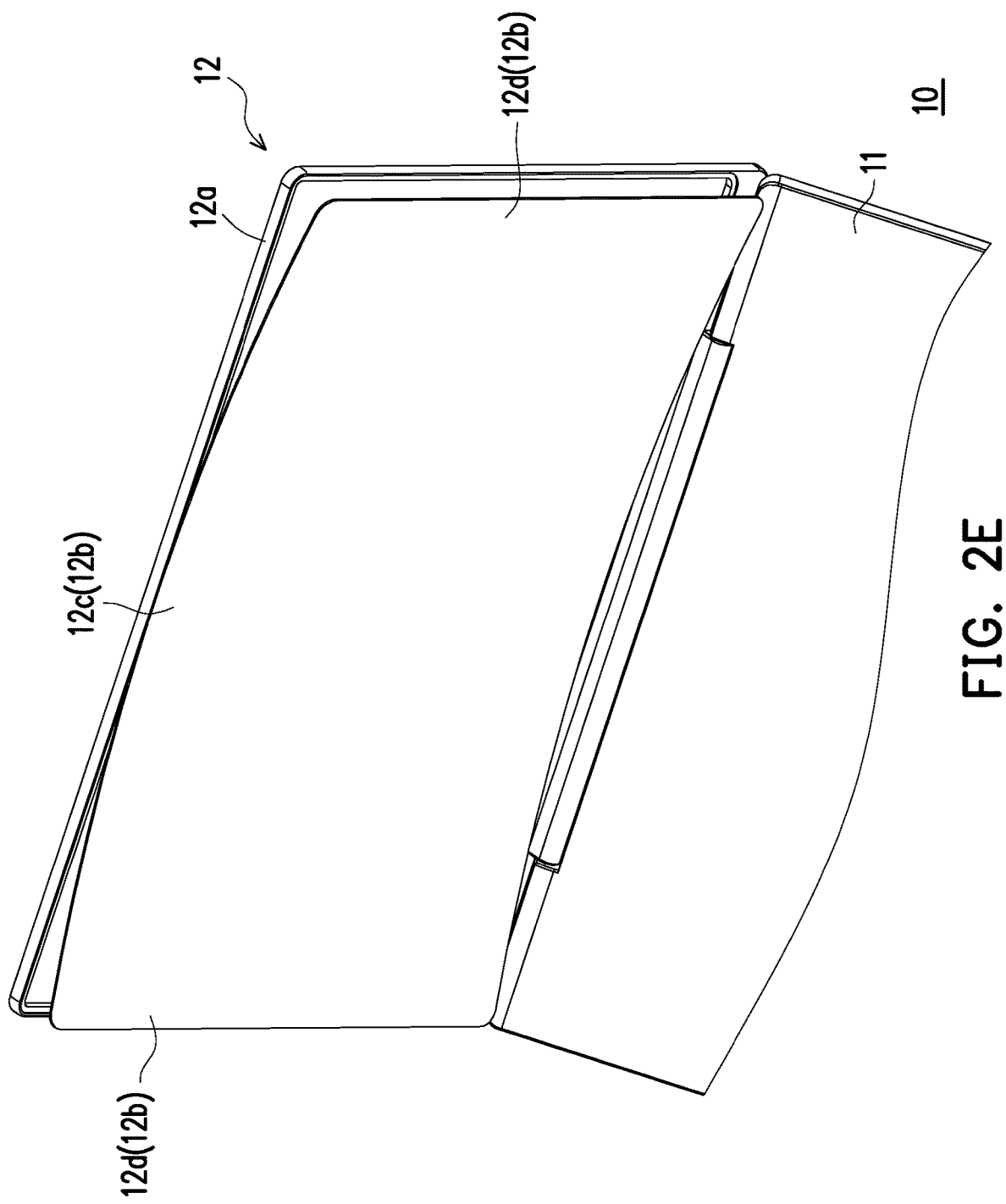
FIG. 2E is a schematic diagram of the electronic device of FIG. 2C in another viewing angle.
Figure 2F:
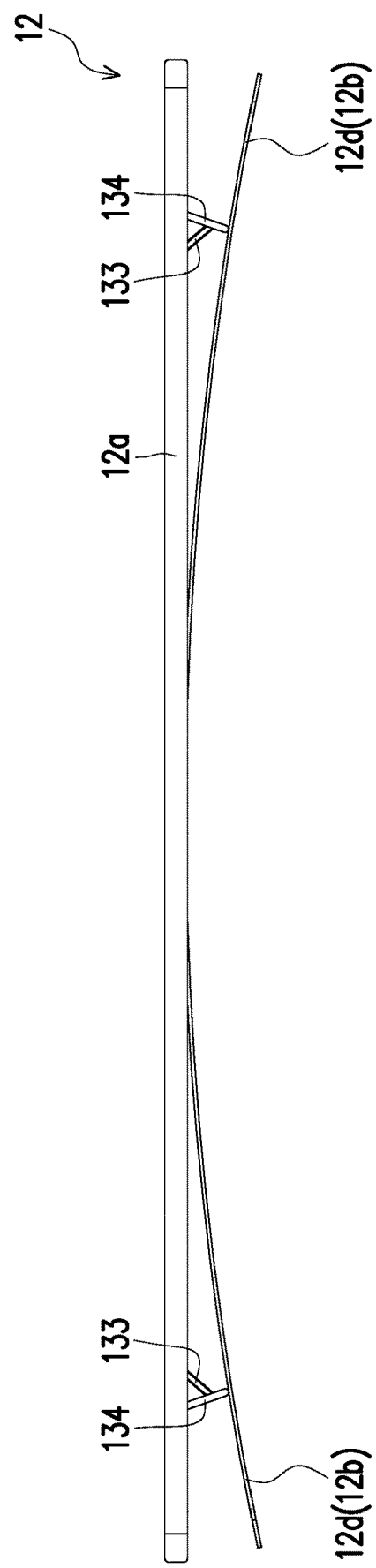
FIG. 2F is a top view of a second body of FIG. 2E.

FIG. 2E is a schematic diagram of the electronic device of FIG. 2C in another viewing angle. FIG. 2F is a top view of the second body of FIG. 2E. Referring to FIG. 2C, FIG. 2E and FIG. 2F, when each of the driving elements 120 drives the corresponding linking assembly 130 to move, each of the side wing portions 12d is driven by a fourth linking element 134 in the linking assembly 130 to bend with respect to the middle portion 12c, such that the flexible screen 12b is similar to a curved-surface display screen, so as to provide users with a surround field of vision to achieve a visual immersion effect.

Referring to FIG. 1A, FIG. 1B, FIG. 2A and FIG. 2B, in the embodiment, the linking assembly 130 includes a first linking element 131, a second linking element 132, a third linking element 133 and the fourth linking element 134, wherein the first linking element 131 may be a link and has a first end 131a, a second end 131b opposite to the first end 131a and a rotating fulcrum 131c located between the first end 131a and the second end 131b. Further, the first linking element 131 is connected to the driving element 120 through the first end 131a, and is pivoted to the casing 12a (shown in FIG. 1C or FIG. 2C) through the rotating fulcrum 131c. On the other hand, the second linking element 132 and the third linking element 133 may be links, wherein an extending direction D1 of the first linking element 131 is intersected with an extending direction D2 of the second linking element 132, and an extending direction of the third linking element 133 is substantially parallel with the extending direction D2 of the second linking element 132.

The first linking element 131 is connected to the second linking element 132 through the first end 131a, wherein the third linking element 133 is connected to the second linking element 132 and a connection relationship there between is a pivot connection. The second linking element 132 is located between the first linking element 131 and the third linking element 133, and the third linking element 133 is located between the second linking element 132 and the fourth linking element 134. The fourth linking element 134 is connected to the third linking element 133, and a connection relationship there between is the pivot connection. On the other hand, an extending direction D3 of the fourth linking element 134 is intersected with the extending direction D2 of the second linking element 132, and the fourth linking element 134 may be a plate member extending along a short side of the casing 12a (shown in FIG. 1C or FIG. 2C). In other embodiments, a structural type of the fourth linking element and a position thereof in the casing may be adjusted according to an actual requirement.

In the embodiment, the first linking element 131 is configured to sway with respect to the casing 12a (shown in FIG. 1C or FIG. 2C) along a rotating axis X1 passing through the rotating fulcrum 131c. The second linking element 132 and the third linking element 133 are configured to rotate along a rotating axis X2 passing through a pivot point between them, and the third linking element 133 and the fourth linking element 134 are configured to rotate along a rotating axis X3 passing through a pivot point between them. The rotating axis X1 is not parallel with the rotating axes X2 and X3, and the rotating axis X2 is substantially parallel with the rotating axis X3. Further, the fourth linking element 134 has a pivot fulcrum 134a located away from the third linking element 133, and is pivoted to the casing 12a (shown in FIG. 1C or FIG. 2C) through the pivot fulcrum 134a. The fourth linking element 134 is configured to rotate with respect to the casing 12a (shown in FIG. 1C or FIG. 2C) along a rotating axis X4 passing through the pivot fulcrum 134a, and the rotating axis X4 is substantially parallel with the rotating axis X3.

When the first end 131a of the first linking element 131 is pushed or pulled by the driving element 120, the first linking element 131 is swayed around the rotating fulcrum 131c, such that the first linking element 131 drives the second linking element 132, the third linking element 133 and the fourth linking element 134 to move through the second end 131b. For example, the second linking element 132 may be limited to slide along a specific direction, so as to drive the third linking element 133 and the fourth linking element 134 to flip relatively, and flip toward the flexible screen 12b (shown in FIG. 2C), such that a contact end 134b away from the pivot fulcrum 134a contacts and pushes the side wing portion 12d (shown in FIG. 2C) of the flexible screen 12b to bend the side wing portion 12d (with respect to the middle portion 12c, shown in FIG. 2C).

In the embodiment, in order to ensure a degree of freedom of motion of the first linking element 131 swaying around the rotating fulcrum 131c, a connection relationship between the first linking element 131 and any one of the driving element 120 and the second linking element 132 is a pivot connection and a sliding connection. Further, the driving element 120 has a first connecting protrusion 122, the first end 131a of the first linking element 131 has a first slide chute 131d, and the first connecting protrusion 122 is rotatably and movably installed in the first slide chute 131d. On the other hand, the second linking element 132 has a second connecting protrusion 132a, the second end 131b of the first linking element 131 has a second slide chute 131e, and the second connecting protrusion 132a is rotatably and movably installed in the second slide chute 131e.

For example, the first connecting protrusion 122 extends from an outer wall of the driving element 120 towards the first end 131a of the first linking element 131, wherein the driving mechanism 100 is configured with a position-limiting frame 160 and the first connecting protrusion 122 penetrates through the position-limiting frame 160. Further, the position-limiting frame 160 is sleeved on the shaft 110, and is adapted to rotate with respect to the shaft 110 along with the second body 12 (referring to FIG. 1C or FIG. 2C). On the other hand, the position-limiting frame 160 has a position-limiting slot 161, and the first connecting protrusion 122 penetrates through the position-limiting slot 161 and is installed in the first slide chute 131d. In order to ensure synchronous movement of the driving element 120 and the second body 12, an inner contour of the position-limiting slot 161 matches and contacts an outer contour of a block of the first connecting protrusion 122 penetrating through the position-limiting slot 161 without influencing a degree of freedom of movement of the driving element 120 with respect to the shaft 110.

Other embodiments are provided below for further description. It should be noted that reference numbers of the components and a part of contents of the aforementioned embodiment are also used in the following embodiment, where the same reference numbers denote the same or like components, and descriptions of the same technical contents are omitted. Different features of each embodiment may also be applied to other embodiments in principle, and the aforementioned embodiment may be referred for descriptions of the omitted parts, and detailed descriptions thereof are not repeated in the following embodiment.

Figure 3A:
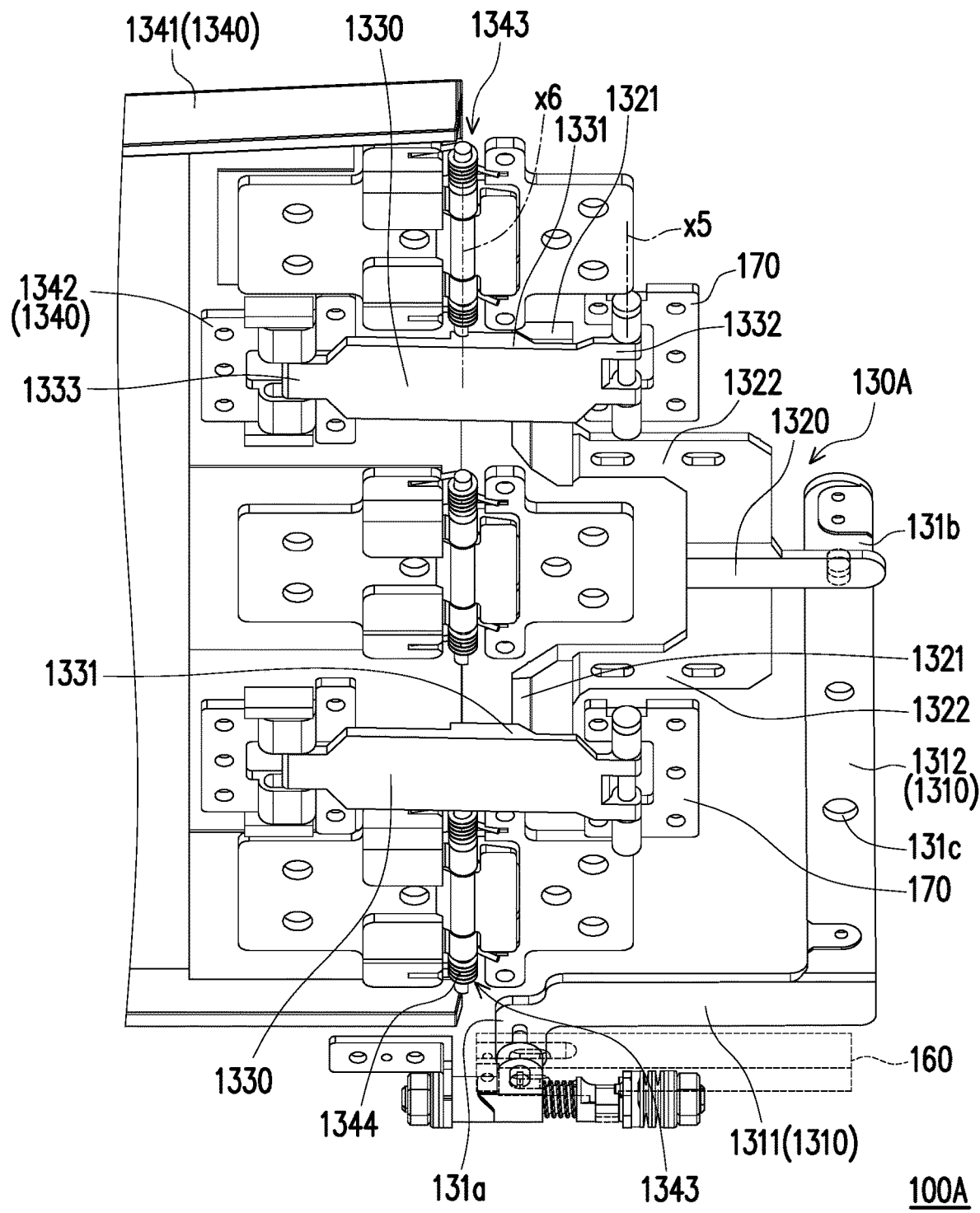
FIG. 3A is a schematic diagram of a driving mechanism before actuation according to a second embodiment of the disclosure.
Figure 3B:
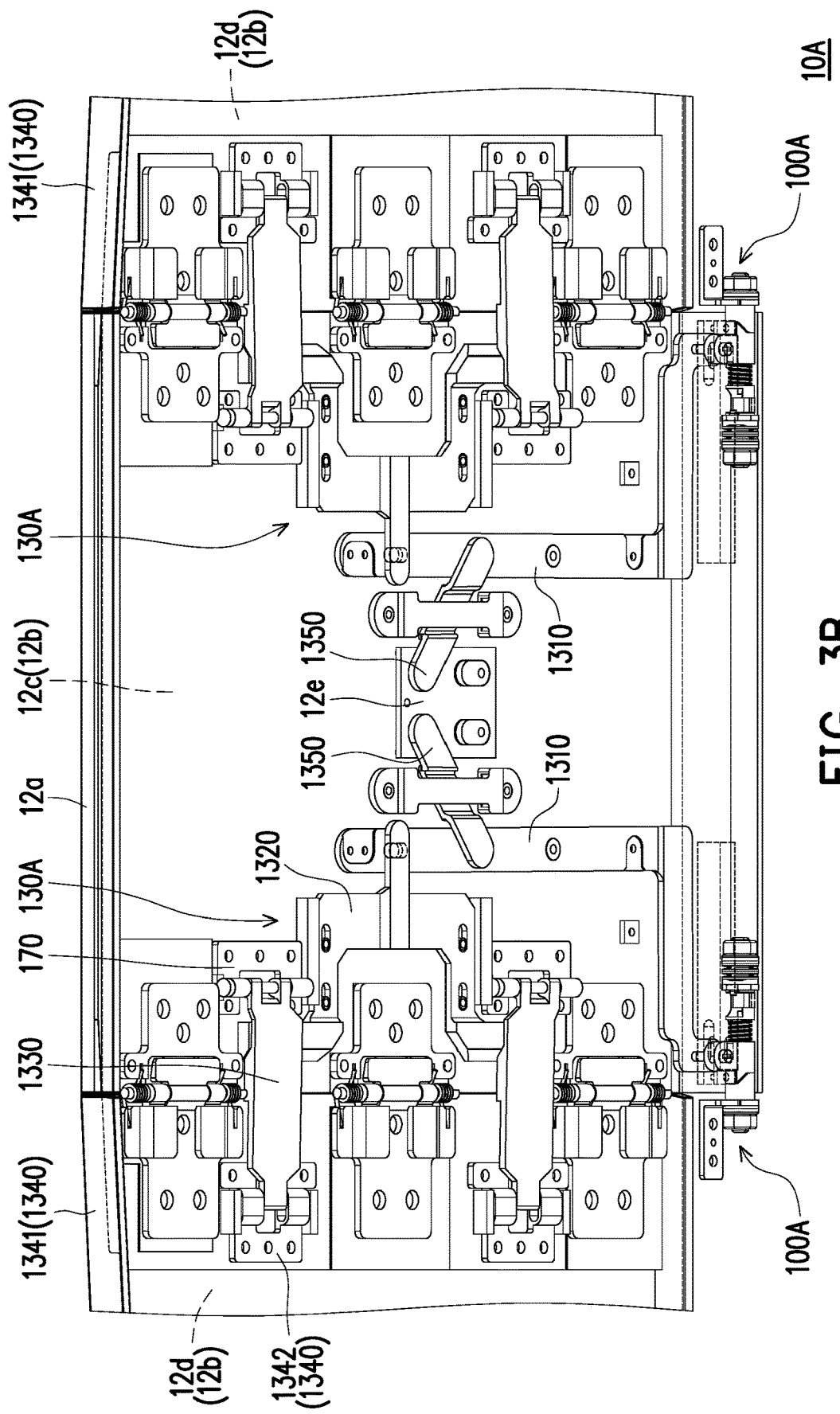
FIG. 3B is a schematic diagram of an electronic device in a folded state according to the second embodiment of the disclosure.
Figure 4A:
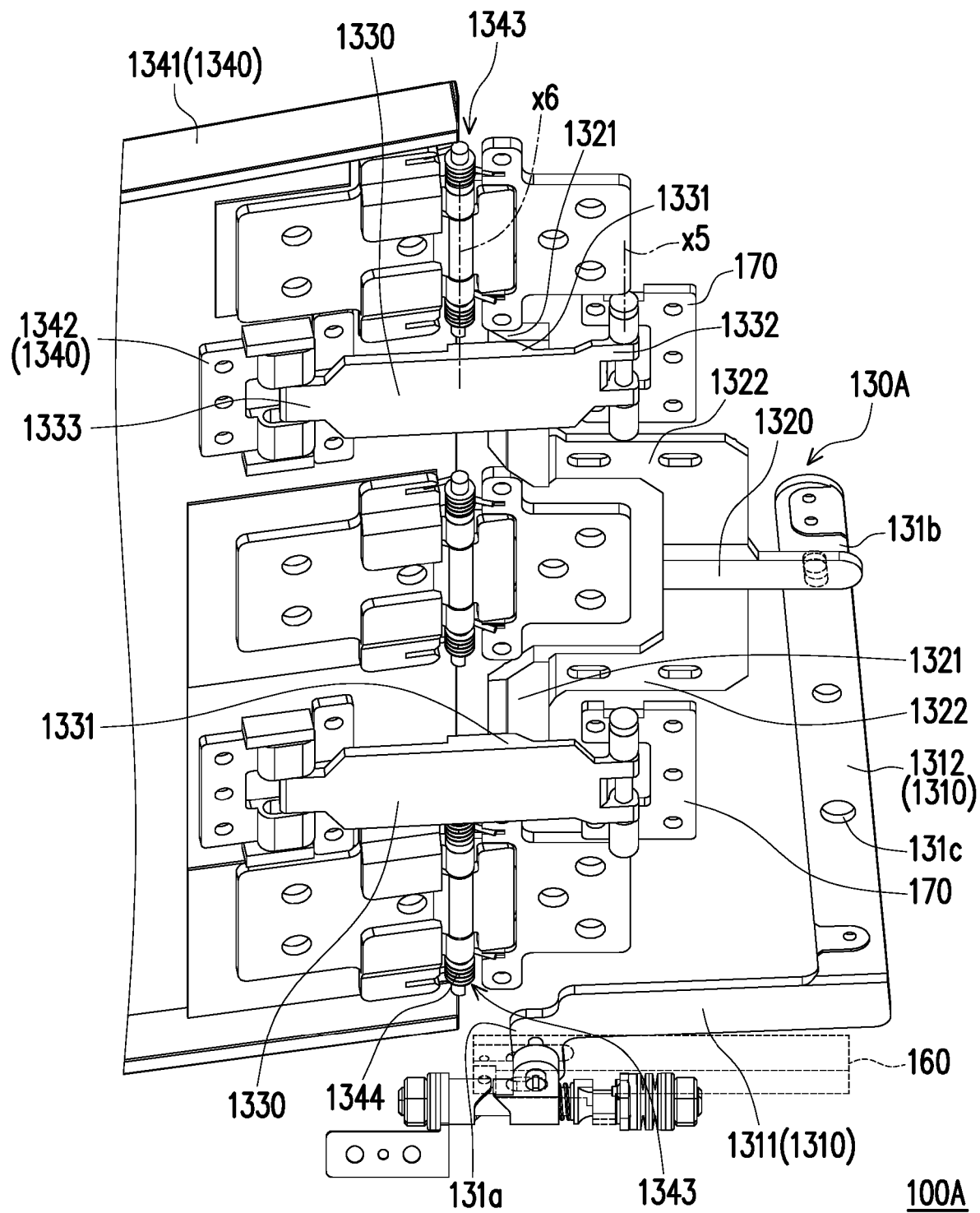
FIG. 4A is a schematic diagram of the driving mechanism after actuation according to the second embodiment of the disclosure.
Figure 4B:
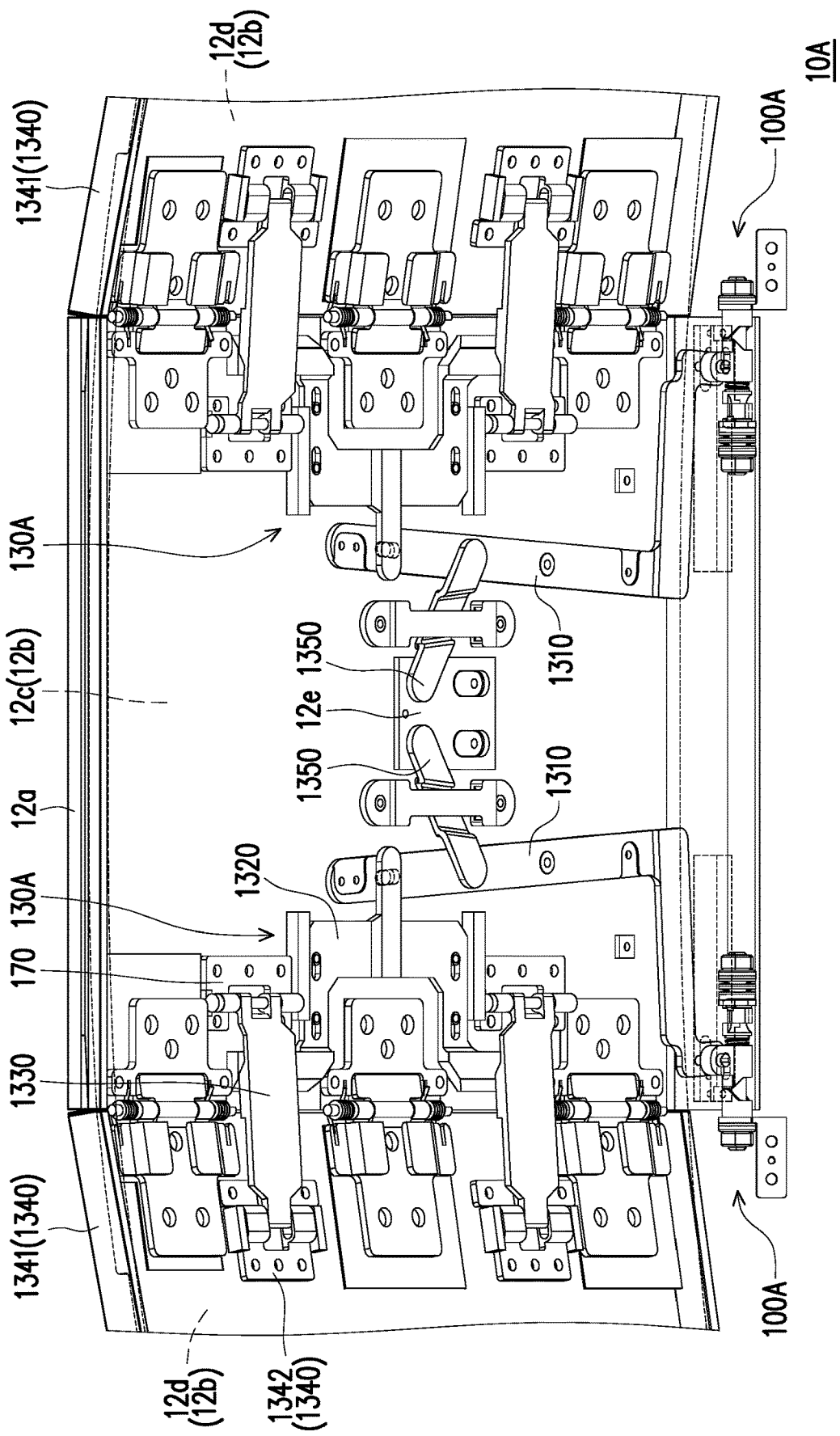
FIG. 4B is a schematic diagram of the electronic device in an unfolded state according to the second embodiment of the disclosure.

FIG. 3A is a schematic diagram of a driving mechanism before actuation according to a second embodiment of the disclosure. FIG. 3B is a schematic diagram of an electronic device in a folded state according to the second embodiment of the disclosure. FIG. 4A is a schematic diagram of the driving mechanism after actuation according to the second embodiment of the disclosure. FIG. 4B is a schematic diagram of the electronic device in an unfolded state according to the second embodiment of the disclosure. For clarity and simplicity's sake, only a part of a flip member 1341 and the side wing portion 12d is illustrated in FIG. 3B and FIG. 4B, and the first body 11 is omitted, the flexible screen 12b of FIG. 3B and FIG. 4B are illustrated in dash lines, and the position-limiting frame 160 of FIG. 3A to FIG. 4B is illustrated in dash lines. Referring to FIG. 3A to FIG. 4B, a design principle of the driving mechanism 100A and the electronic device 10A of the embodiment is similar to a design principle of the driving mechanism 100 and the electronic device 10 of the first embodiment, and main differences there between lie in a structural type of the linking assembly, an actuation method of the linking assembly and a bending method of the flexible screen.

In the embodiment, a structure of the first linking element 1310 of the linking assembly 130A is approximately an L-shape, wherein the first linking element 1310 includes a first section 1311 and a second section 1312 intersected with the first section 1311, and the first section 1311 is connected to the driving element 120 through the first end 131a. On the other hand, the second section 1312 is connected to the second linking element 1320 through the second end 131b, and the second section 1312 is pivoted to the casing 12a through the rotating fulcrum 131c. The second linking element 1320 has a push leaning portion 1321 opposite to the second end 131b of the first linking element 1310, for leaning against an abutting portion 1331 of the third linking element 1330. For example, the number of the third linking elements 1330 may be two, and the second linking element 1320 is located between the two third linking elements 1330. The second linking element 1320 has two branches 1322, where each of the branches 1322 has the push leaning portion 1321 extending towards the corresponding third linking element 1330 to abut against the corresponding abutting portion 1331. In other embodiments, the structural type of the first linking element, the structural type of the second linking element and the number of the third linking elements may all be adjusted according to an actual requirement.

For example, the second linking element 1320 may be driven by the second end 131b of the first linking element 1310 to slide along a specific direction, and when each of the push leaning portions 1321 of the second linking element 1320 pushes the abutting portion 1331 of the corresponding third linking element 1330, the third linking element 1330 is subjected to a force to produce a corresponding degree of motion, and the third linking element 1330 also drives the fourth linking element 1340 to produce a corresponding degree of motion. Further, the third linking element 1330 is pivoted to the casing 12a along a rotating axis X5, and the fourth linking element 1340 is pivoted to the casing 12a along a rotating axis X6 parallel with the rotating axis X5. Furthermore, the linking assembly 130A includes pivot bases 170, wherein the pivot bases 170 are fixed to the casing 12a, and the number of the pivot bases 170 is the same with the number of the third linking elements 1330.

Each of the third linking elements 1330 further has a pivot portion 1332 and a slide connecting portion 1333, wherein the push leaning portion 1321 is located between the pivot portion 1332 and the slide connecting portion 1333, and the pivot portion 1332 is pivoted to the pivot base 170 along the rotating axis X5. On the other hand, the fourth linking element 1340 includes the flip member 1341 and a slide connecting base 1342 fixed on the flip member 1341, wherein the flip member 1341 is disposed at a side edge of the casing 12a and the flip member 1341 is pivoted to the casing 12a through a pivot fulcrum 1343 along the rotating axis X6. For example, the pivot fulcrum 1343 may be composed of three shaft structures arranged in parallel, so as to enhance stability of the flip member 1341 when the flip member 1341 is rotated with respect to the casing 12a, though the number of the shaft structures is not limited by the disclosure. On the other hand, the pivot fulcrum 1343 may be configured with a torsion spring 1344 to enhance stability of the flip member 1341 when the flip member 1341 is rotated with respect to the casing 12a, and provide a restoring force for restoring the flip member 1341.

In the embodiment, each of the third linking elements 1330 strides across the casing 12a and the flip member 1341, wherein the pivot portion 1332 is pivoted to the pivot base 170 and the slide connecting portion 1333 is slidably connected to the slide connecting base 1342. On the other hand, the pivot fulcrum 1343 is located between the pivot portion 1332 and the slide connecting portion 1333. To be more specific, the rotating axis X6 passing through the pivot fulcrum 1343 extends between the pivot base 170 and the slide connecting base 1342. When each of the push leaning portions 1321 of the second linking element 1320 pushes the abutting portion 1331 of the corresponding third linking element 1330, the pivot portion 1332 of each of the third linking elements 1330 is rotated with respect to the pivot base 170, and the slide connecting portion 1333 slides with respect to the slide connecting base 1342 to drive the flip member 1341 to rotate with respect to the casing 12a.

Figure 4C:
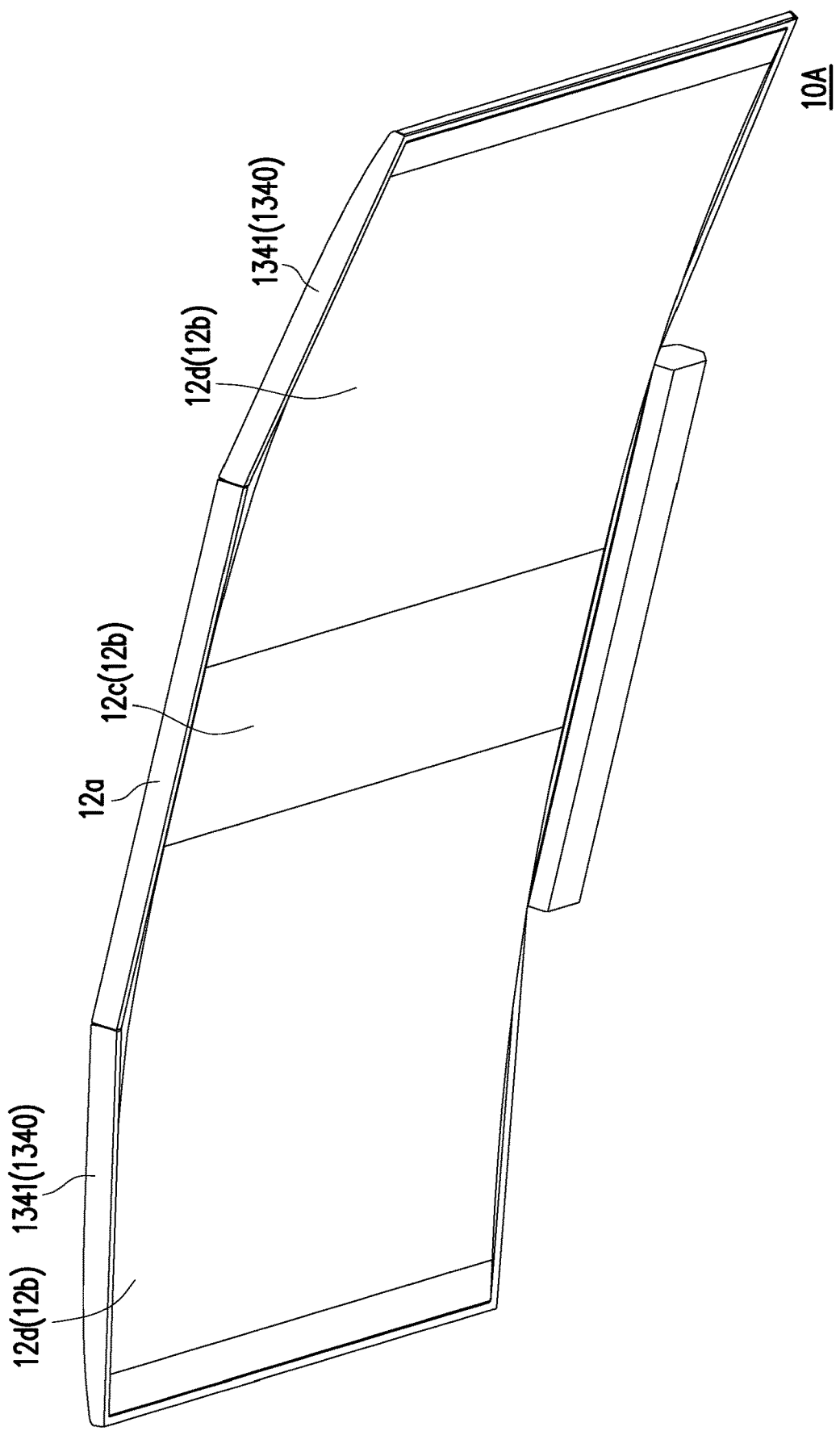
FIG. 4C is a schematic diagram of the electronic device of FIG. 4B in another viewing angle.
Figure 4D:
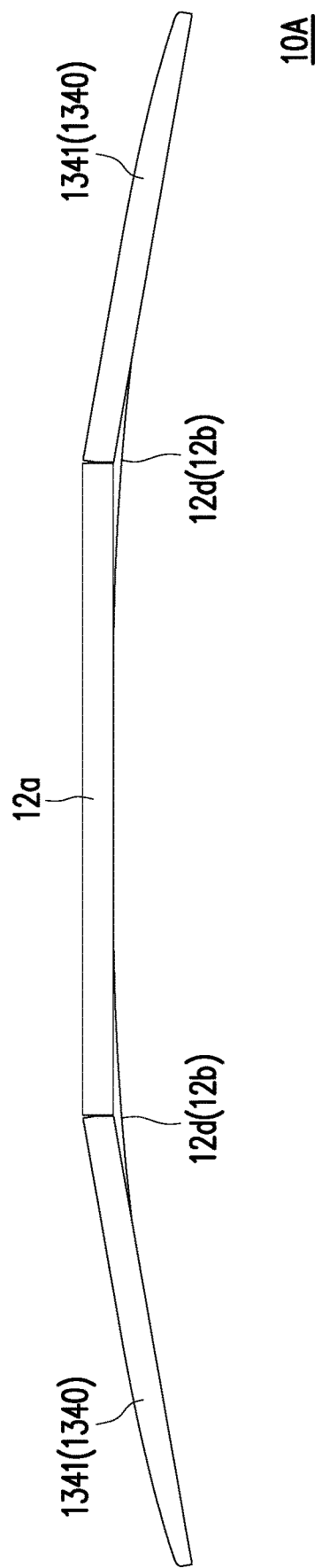
FIG. 4D is a top view of the electronic device of FIG. 4C.

FIG. 4C is a schematic diagram of the electronic device of FIG. 4B in another viewing angle. FIG. 4D is a top view of the electronic device of FIG. 4C. referring to FIG. 4A to FIG. 4D, the middle portion 12c of the flexible screen 12b is fixed to the casing 12a, and the side wing portion 12d is installed on the flip member 1341, so that the side wing portion 12d may be bent with respect to the middle portion 12c along with a motion of the flip member 1341. In the embodiment, since the two driving mechanisms 100A are symmetrically disposed in the electronic device 10A, and the linking assembly 130A of each of the driving mechanisms 100A is disposed corresponding to one side wing portion 12d, when each of the driving elements 120 drives the corresponding linking assembly 130A to move, each of the side wing portions 12d is driven by the corresponding linking assembly 130A to bend with respect to the middle portion 12c. As shown in FIG. 4B to FIG. 4D, the flexible screen 12b is similar to a curved-surface display screen, and is adapted to provide users with a surround field of vision to achieve a visual immersion effect. On the other hand, in order to ensure synchronous movement of the two linkage assemblies 130A, and ensure consistency of actuation strokes of the two linkage assemblies 130A, the first linking element 1310 of each of the linkage assemblies 130A may be pivoted to a linking base 12e through a linking rod 1350, wherein the linking base 12e is located between the two first linking elements 1310, and is slidably disposed on the casing 12a, so as to slide with respect to the casing 12a along a specific direction.

In summary, the electronic device of an embodiment of the disclosure is integrated with the driving mechanism, which is configured to make the second body to rotate with respect to the first body. Moreover, during the process that the second body is unfolded with respect to the first body, the linking assembly of the driving mechanism may be driven by the driving element to produce a motion, so as to drive the flexible screen of the second body to produce a corresponding degree of bending. On the other hand, when the electronic device is in the folded state, the flexible screen is not bent (i.e. keeps flat), so that the thickness of the electronic device is not increased, so as to meet the design requirement of product thinning. In other words, by rotating the second body with respect to the first body, the flexible screen is switched between a bending state and a flat state, which is very convenient for the user to use. Moreover, the bent flexible screen may provide the users with a surround field of vision, so as to achieve a visual immersion effect.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An electronic device, comprising:
   a first body;
   a second body, comprising a casing and a flexible screen installed on the casing; and
   at least one driving mechanism, comprising:
      a shaft, having a first connecting portion and a second connecting portion opposite to each other, wherein the first connecting portion is fixed to the first body, and the second body is pivoted to the second connecting portion;
      a driving element, sleeved on the shaft and located in the casing; and
      a linking assembly, carried by the casing and covered by the flexible screen,
   wherein when the second body is folded onto the first body, the flexible screen keeps flat, when the second body is unfolded with respect to the first body, the driving element is rotated and moved with respect to the shaft to drive the linking assembly to move, and the linking assembly drives the flexible screen to bend.

2. The electronic device as claimed in claim 1, wherein the linking assembly comprises:
   a first linking element, having a first end, a second end opposite to the first end and a rotating fulcrum located between the first end and the second end, wherein the first end is connected to the driving element;
   a second linking element, connected to the second end;
   a third linking element, connected to the second linking element, and the second linking element being located between the first linking element and the third linking element; and
   a fourth linking element, connected to the third linking element, and the third linking element being located between the second linking element and the fourth linking element,
   wherein the driving element is configured to rotate and move with respect to the shaft when the second body is rotated with respect to the first body, so as to drive the first linking element to sway around the rotating fulcrum, such that the first linking element drives the second linking element, the third linking element and the fourth linking element to move through the second end, and thus make the fourth linking element drive the flexible screen to bend.

3. The electronic device as claimed in claim 2, wherein the driving element has a connecting protrusion, the first end of the first linking element has a slide chute, and the connecting protrusion is rotatably and movably installed in the slide chute.

4. The electronic device as claimed in claim 2, wherein the second linking element has a connecting protrusion, the second end of the first linking element has a slide chute, and the connecting protrusion is rotatably and movably installed in the slide chute.

5. The electronic device as claimed in claim 2, wherein the second linking element and the third linking element are pivoted to each other, and the third linking element and the fourth linking element are pivoted to each other, the fourth linking element has a pivot fulcrum away from the third linking element, and the fourth linking element is pivoted to the casing through the pivot fulcrum, the second end of the first linking element is configured to drive the second linking element to move, so as to drive the third linking element to rotate with respect to the second linking element, the third linking element and the fourth linking element to rotate with respect to each other and the fourth linking element to rotate around the pivot fulcrum, and the fourth linking element contacts the flexible screen through a contact end away from the pivot fulcrum.

6. The electronic device as claimed in claim 2, wherein the second linking element has a push leaning portion opposite to the second end of the first linking element, and the third linking element has an abutting portion leaning against the push leaning portion, the second end of the first linking element is configured to drive the second linking element to move, so as to make the push leaning portion pushing the abutting portion, such that the third linking element is rotated along a first rotating axis and drives the fourth linking element to rotate along a second rotating axis parallel with the first rotating axis.

7. The electronic device as claimed in claim 6, wherein the linking assembly further comprises a pivot base fixed to the casing, wherein the third linking element has a pivot portion and a slide connecting portion, the push leaning portion is located between the pivot portion and the slide connecting portion, and the pivot portion is pivoted to the pivot base along the first rotating axis, the fourth linking element comprises a flip member and a slide connecting base fixed on the flip member, and the slide connecting portion is slidably connected to the slide connecting base.

8. The electronic device as claimed in claim 7, wherein the flip member has a pivot fulcrum, the second rotating axis passes through the pivot fulcrum, and is located between the pivot portion and the slide connecting portion.

9. The electronic device as claimed in claim 8, wherein the flip member is pivoted to the casing through the pivot fulcrum, and the flexible screen comprises a middle portion and a side wing portion, the middle portion is fixed on the casing, and the side wing portion is installed on the flip member.

10. The electronic device as claimed in claim 2, wherein the flexible screen comprises a middle portion and two side wing portions, the middle portion is located between the two side wing portions, and is fixed on the casing, wherein the number of the driving mechanisms is two, each of the side wing portions is correspondingly configured with one of the driving mechanisms, and each of the fourth linking elements is configured to drive the corresponding side wing portion to bend with respect to the middle portion.

11. The electronic device as claimed in claim 1, wherein the driving mechanism comprises a guiding element fixed to the shaft and located in the casing, the guiding element has a first guiding surface, the driving element has a second guiding surface matching the first guiding surface, and the second guiding surface leans against the first guiding surface, and during a process that the driving element is rotated with respect to the shaft, the second guiding surface and the first guiding surface push against each other to move the driving element with respect to the shaft.

12. The electronic device as claimed in claim 11, wherein the first guiding surface of the guiding element has a first buffer section and a guiding section connected to the first buffer section, and the second guiding surface of the driving element has a driving section, the driving section is configured to move on the first buffer section and the guiding section, and when the driving section moves on the guiding section and is separated from the first buffer section, the driving element is moved with respect to the shaft.

13. The electronic device as claimed in claim 12, wherein the first guiding surface of the guiding element further has a second buffer section connected to the guiding section, and the guiding section is located between the first buffer section and the second buffer section, and when the driving section is moved out of the guiding section and moved into the second buffer section, the driving element stops moving with respect to the shaft.

14. The electronic device as claimed in claim 11, wherein the driving mechanism further comprises an elastic element disposed in the casing, wherein the shaft has a position-limiting portion, the driving element is configured to move between the position-limiting portion and the guiding element, and two opposite ends of the elastic element are respectively connected to the position-limiting portion and the driving element.

* * * * *